(12) United States Patent
Ueda

(10) Patent No.: US 6,577,883 B1
(45) Date of Patent: Jun. 10, 2003

(54) METHOD OF DETECTING BATTERY PACK TYPE AND MOBILE ELECTRONIC DEVICE

(75) Inventor: Hideki Ueda, Saitama (JP)

(73) Assignee: NEC Corporation, Tokyo (JP)

( * ) Notice: Subject to any disclaimer, the term of this patent is extended or adjusted under 35 U.S.C. 154(b) by 473 days.

(21) Appl. No.: 09/626,001

(22) Filed: Jul. 26, 2000

(30) Foreign Application Priority Data

Jul. 26, 1999  (JP) ............................................ 11-210328

(51) Int. Cl.⁷ .............................. H04B 1/38; H04M 1/00
(52) U.S. Cl. ...................... 455/573; 455/90; 320/138
(58) Field of Search .............................. 455/573, 572, 455/550, 557, 559, 575, 90; 320/150, 152, 156, 157, 138

(56) References Cited

U.S. PATENT DOCUMENTS

| | | | |
|---|---|---|---|
| 5,164,652 A | * 11/1992 | Johnson et al. | ............. 320/106 |
| 5,999,832 A | * 12/1999 | Vannatta et al. | ............. 455/575 |
| 6,163,712 A | * 12/2000 | Winkler et al. | ............. 455/572 |

* cited by examiner

*Primary Examiner*—Nguyen T. Vo
*Assistant Examiner*—Edan Orgad
(74) *Attorney, Agent, or Firm*—Dickstein, Shapiro, Morin & Oshinsky, LLP.

(57) ABSTRACT

A method of detecting the type of a battery pack in a mobile electronic device is provided, which detects the type of a battery pack connected in a mobile electronic device even if no dedicated terminals are provided to a battery pack. (a) A first battery pack connectable to the body is provided. (b) A second battery pack connectable to the body and different in characteristic from the first pack is provided. Each of the first and second packs has a battery cell, first and second terminals respectively connected to high- and low-potential side terminals of the cell, a third terminal, and a temperature detection element connected across the first and second terminals. (c) The body is provided with fourth, fifth, and sixth terminals connectable respectively to the first, second, and third terminals of the first or second battery pack. The body has a resistive voltage divider circuit connected among the fourth, fifth, and sixth terminals. (d) The first or second pack is connected to the body in such a way that the fourth, fifth, and sixth terminals of the body are connected to the first, second, and third terminals of the first or second battery pack, respectively. (e) An output voltage of the divider is detected to thereby generate a detection result. (f) Whether the first or second pack is connected to the body is detected based on the detection result.

8 Claims, 9 Drawing Sheets

METHOD OF DETECTING BATTERY PACK TYPE AND MOBILE ELECTRONIC DEVICE

BACKGROUND OF THE INVENTION

1. Field of the Invention

The present invention relates to a method of detecting the connection of a battery pack to a portable or mobile electronic device such as mobile phones and a mobile electronic device using the method. More particularly, the invention relates to a method of detecting whether or not a specific battery pack is connected to the body of a mobile electronic device that makes it possible to recognize the connection and type of the battery pack without providing discrimination-dedicated terminals, and a mobile electronic device capable of connection of battery packs having different characteristics.

2. Description of the Related Art

In recent years, various portable or mobile electronic equipment such as mobile or cellular phones, personal handyphone systems (PHSs), notebook computers, and digital cameras, have been developed and extensively used. The mobile electronic equipment, which may be termed "mobile electronic devices" later, require high-level transportability and therefore, they need to be compact and light-weight and operable with a battery pack as its power supply.

Typically, the battery pack applicable to portable electronic equipment comprises at least one chargeable battery cell in its inside. Several types of chargeable battery cells have been already developed and commercially produced and sold for this purpose. They are different in battery characteristics such as capacity, discharge characteristic, and necessary charging period from each other. According to the types of chargeable battery cells, several types of battery packs have been already commercially produced and sold so far.

To make it possible to apply different types of battery packs to mobile electronic devices of this sort, mobile electronic devices need to discriminate the type of sort of battery packs connected or installed and to switch their operating condition according to the current type/sort of battery packs. Also, with mobile electronic devices chargeable without separating battery packs, the charging voltage to battery packs is required to be controlled or adjusted in the devices according to the current type/sort of battery packs.

To meet the above-described requirement, conventionally, prior-art mobile electronic devices capable of using different types of battery packs comprises dedicated terminals for discriminating the type of battery packs connected. The discrimination-dedicated terminals are provided in both battery packs and the body of devices.

As an example of mobile electronic devices of this sort, a conventional mobile phase capable of the alternative use of two different types of battery packs is explained below with reference to FIGS. 1 to 3.

FIGS. 1 and 2 are schematic, partial circuit diagrams of two different-type battery packs for a conventional mobile phone, respectively. FIG. 3 is a schematic, partial circuit diagram of the body of the same phone.

As shown in FIG. 1, a first battery pack 40 comprises a switch (SW) 41, a protection circuit 42, a lithium (Li)-ion battery cell 43, a thermistor 44, a resistor 45, a power supply terminal (i.e., +V terminal) 401, a discrimination terminal (i.e., SEL terminal) 402, a temperature detection terminal (i.e., TH terminal) 403, and a ground terminal (i.e., GND terminal) 404. The switch 41, the protection circuit 42, the cell 43, the thermistor 44, and the resistor 45 are provided in the enclosure or casing (not shown) of the first battery pack 40. The power-supply terminal 401, the discrimination terminal 402, the temperature detection terminal 403, and the ground terminal 404 are exposed to the outside from the enclosure.

The positive terminal of the battery cell 43 is connected to the power-supply terminal 401 by way of the switch 41. The negative terminal of the battery cell 43 is directly connected to the ground terminal 401. The battery voltage $V_{BAT1}$, which is generated between the positive and negative terminals of the cell 43, is outputted from the power supply and ground terminals 401 and 404.

The protection circuit 42 is supplied with the battery voltage $V_{BAT1}$ from the cell 43. The circuit 42 generates the switch control signal $V_{SW1}$ on the basis of the voltage $V_{BAT1}$ and then, supplies the signal $V_{SW1}$ thus generated to the switch 41. The ground terminal of the circuit 42 is connected to the ground terminal 404.

The switch 41 serves to connect the positive terminal of the battery cell 43 to the power supply terminal 401 or disconnects the same from the terminal 401 according to the switch control signal $V_{S1}$ from the protection circuit 42.

The resistor 45 is connected across the discrimination terminal 402 and the ground terminal 404.

The thermistor 44 is connected across the temperature detection terminal 403 and the ground terminal 404. To facilitate detection of the temperature of the cell 43, the thermistor 44 is located in the vicinity of the battery cell 43 in the battery enclosure.

With the first battery pack 40 having the above-described configuration, the switch 41 is turned on or off by the control signal $V_{SW1}$ from the protection circuit 42, thereby controlling the output of the battery voltage $V_{BAT1}$ from the power-supply and ground terminals 401 and 404. Specifically, in the normal operation state where the voltage $V_{BAT1}$ is equal to or higher than a specific value, the switch 41 is turned on by the control signal $V_{SW1}$, outputting the voltage $V_{BAT1}$ from the terminals 401 and 404. On the other hand, in the abnormal operation state where the voltage $V_{BAT1}$ is less than the specific value, the switch 41 is turned off by the control signal $V_{SW1}$, stopping the output of the voltage $V_{BAT1}$ from the terminals 401 and 404.

The resistance $R_{TH1}$ of the thermistor 44 varies according to the temperature of the battery cell 43. Thus, when a proper circuit that generates a voltage corresponding to the resistance $R_{TH1}$ is connected to the temperature detection terminal 403, the temperature of the cell 43 can be detected on the basis of the voltage thus generated.

When a specific circuit is connected to the discrimination terminal 403, the type or sort of the first battery pack 40 can be discriminated.

Next, a second battery pack 50 is explained below.

As shown in FIG. 2, the second battery pack 50 has approximately the same configuration as the first battery pack 40 except that a resistor 55 corresponding to the resistor 45 is connected across a power supply terminal 501 and a discrimination terminal 502.

Specifically, the second battery pack 50 comprises a switch 51, a protection circuit 52, a Li-ion battery cell 53, a thermistor 54, a resistor 55, a power-supply terminal 501, a discrimination terminal 502, a temperature detection terminal 503, and a ground terminal 504. The switch 51, the protection circuit 52, the cell 53, the thermistor 54, and the resistor 55 are provided in the enclosure (not shown) of the pack 50. The power-supply terminal 501, the discrimination terminal 502, the temperature detection terminal 503, and the ground terminal 504 are exposed to the outside from the enclosure. The battery cell 53 is different in characteristic from the battery cell 43.

The positive terminal of the cell 53 is connected to the power-supply terminal 501 by way of the switch 51. The negative terminal of the cell 53 is directly connected to the ground terminal 504. The battery voltage $V_{BAT2}$, which is generated between the positive and negative terminals of the cell 53, is outputted from the power-supply and ground terminals 501 and 504.

The protection circuit 52 is supplied with the battery voltage $V_{BAT2}$ from the cell 53. The circuit 52 generates the switch control signal $V_{SW2}$ on the basis of the voltage $B_{BAT2}$ and then, supplies the signal $V_{SW2}$ thus generated to the switch 51. The ground terminal of the circuit 52 is connected to the ground terminal 504.

The switch 51 serves to connect the positive terminal of the battery cell 53 to the power supply terminal 501 or disconnects the same from the terminal 501 according to the switch control signal $V_{SW2}$ from the protection circuit 52.

The resistor 55 is connected across the discrimination terminal 502 and the ground terminal 504.

The thermistor 54 is connected across the temperature detection terminal 503 and the ground terminal 504. To facilitate detection of the temperature of the cell 53, the thermistor 54 is located in the vicinity of the battery cell 53 in the battery enclosure.

With the second battery pack 50 having the above-described configuration, similar to the first battery pack 40 shown in FIG. 1, the switch 51 is turned on or off by the control signal $V_{SW2}$ generated by the protection circuit 52, thereby controlling the output of the battery voltage $V_{BAT2}$ from the power-supply and ground terminals 501 and 504. Specifically, in the normal operation state where the voltage $V_{BAT2}$ is equal to or higher than a specific value, the switch 51 is turned on by the control signal $V_{CON2}$, outputting the voltage $V_{BAT2}$ through the terminals 501 and 504. On the other hand, in the abnormal operation state where the voltage $V_{BAT2}$ is less than the specific value, the switch 51 is turned off by the signal $V_{SW2}$, stopping the output of the voltage $V_{BAT2}$ through the terminals 501 and 504.

The resistance $R_{TH2}$ of the thermistor 54 varies according to the temperature of the battery cell 53. Thus, the similar to the first battery pack 40, when a proper circuit that generates a voltage corresponding to the resistance $R_{SW2}$ is connected to the temperature detection terminal 503, the temperature of the cell 53 can be detected on the basis of the voltage thus generated.

When a specific circuit is connected to the discrimination terminal 503, the type or sort of the second battery pack 50 can be discriminated.

Subsequently, the body of the mobile phone, i.e., the phone body 60, is explained below with reference to FIG. 3.

As shown in FIG. 3, the phone body 60 comprises a switch 61, a charging controller 62, two comparators 63 and 64, a diode 65 for stopping the reverse current, four resistors 66, 67, 68, and 69, a power supply IC (Integrated Circuit) 70 with specific control functions, a power supply terminal 60, a discrimination terminal 602, a temperature detection terminal 603, two ground terminals 604 and 606, and a charging terminal 605. The switch 61, the charge control section 62, two comparators 63 and 64, the diode 65, the resistors 66, 67, 68, and 69, and the power supply IC 70 are provided in the enclosures (not shown) of the body 60. The power supply terminal 601, the discrimination terminal 602, the temperature detection terminal 603, the ground terminals 604 and 606, and the charging terminal 605 are exposed to the outside from the enclosure. The ground terminal 604 is used for connection of the first or second battery pack 40 or 50. The ground terminal 606 is used for connection of a specific charging device.

The power supply terminal 601 is connected to the ground terminals 604 and 606 by way of the serially-connected resistors 66 and 67. Also, the terminal 602 is connected to the charge input terminal 605 by way of the switch 61 and the diode 65. The terminal 601 is further connected to the power supply IC 70 incorporated into the inside of the body 60.

The serially-connected resistors 68 and 69 are connected parallel to the serially-connected resistors 66 and 67 between the power supply terminal 601 and the ground terminal 604.

The discrimination terminal 602 is connected to the connection point of the resistors 68 and 69 and the input terminal of the first comparator 63. The resistors 68 and 69 serve as a pull-up resistor and a pull-down resistor for the terminal 602, respectively. The output terminal of the first comparator 63 is connected to the charging controller 62 and thus, the output signal $V_{COMP1}$ of the first comparator 63 is inputted in to the controller 62.

The temperature detection terminal 603 is connected to the connection point of the resistors 66 and 67 and the input terminal of the second comparator 64. The resistors 66 and 67 serve as a pull-up resistor and a pull-down resistor for the terminal 603, respectively. The output terminal of the second comparator 64 to connected to the charging controller 62 and thus, the output signal $V_{COMP2}$ of the second comparator 64 is inputted in to the controller 62.

The charging controller 62, which is connected to the cathode of the diode 65 and the ground terminal 606, receives the output signals $V_{COM1}$ and $V_{COM2}$ from the first and second comparators 63 and 64. The charging controller 62 controls or adjusts the charge voltage $V_{CHG}$ at the connection point of the switch 61 and the diode 65 on the basis of the output signal $V_{COM1}$ of the first comparator 63 thus received. The charging controller 62 outputs the control signal $V_{CW3}$ to the switch 61 on the basis of the output signal $V_{COM2}$ of the second comparator 64 thus received.

The switch 61 serves to connect the diode 65 to the power supply terminal 601 or disconnect if from the terminal 601 according to the control signal $V_{SW}$ sent from the controller 62.

One of the first and second battery packs 10 and 50 is alternately connected to the phase body 60, constituting the mobile phone. This phone to which the first or second battery pack 40 or 50 is connected operates in the following way.

FIG. 4 shows the configuration of the conventional mobile phone having the first battery pack 40, in which the power supply terminal 401, the discrimination terminal 402, the temperature detection terminal 403, and the ground terminal 404 of the first battery pack 40 are connected to the power supply terminal 601, the discrimination terminal 602, the temperature detection terminal 603, and the ground terminal 604 of the phone body 60, respectively.

When the phone body 60 is in its normal operation, the power supply terminal 601 is supplied with the first battery voltage $V_{BAT1}$ of the first battery pack 40. The first battery voltage $V_{BAT1}$ thus supplied is then supplied to the power supply IC 70, generating specific inner-circuit voltages with specific values. These inner-circuit voltages are respectively supplied to the inner circuit blocks of the phone body 60, such as the ratio, display, and control sections (not shown).

The first battery voltage $V_{BAT1}$ supplied by the first pack 40 is divided by the resistor 45 of the pack 40 and the resistors 68 and 69 of the body 60, generating a first discrimination voltage $V_A$ at the connection point of the resistor 68 and 69. The first discrimination voltage $V_A$, which has a relatively lower value, is inputted into the first comparator 63. The first comparator 63 generates the output signal $V_{COM1}$ having a logic value corresponding to the value of the discrimination voltage $V_A$ thus inputted and then, sends the output signal $V_{COM1}$ to the charging controller 62 of the phone body 60. According to the output signal $V_{COM1}$ thus sent, the controller 62 recognizes that the first battery pack 40 is connected to the body 60.

On the other hand, when the phone body 60 is in its charging operation, a specific charging apparatus (not shown) is connected across the charging terminal 605 and the ground terminal 606, supplying a charge current $I_{CHG}$ to the body 60 through the terminal 605. Part of the charge current $I_{CHG}$ is sent to the charging controller 62 as a control current $I_{COS}$, thereby generating the charge voltage $V_{CHG}$ at the connection point of the switch 61 and the diode 65 in the body 60. As explained above, the controller 62 is recognized that the first battery pack 40 has been connected to the body 60 and therefore, the controller 62 controls the value of the control current $I_{CON}$ to thereby adjust the value of the charge voltage $V_{CHG}$ according to the charge characteristic of the battery cell 43.

The charge voltage $V_{CHG}$ thus generated is outputted through the power supply terminal 601 by way of the switch 61 and then, is supplied to the battery cell 43 of the first battery pack 40 by way of the power supply terminal 401 and the switch 41. As a result, a specific charging current is supplied to the cell 43 to charge the same.

The diode 65 of the body 60 serves to prevent the reverse current from flowing toward the charge apparatus from the cell 43.

During the charging operation, the charging voltage $V_{CHG}$ is divided by the thermistor 44 of the pack 40 and the resistors 66 and 67 of the body 60, thereby generating the temperature detection voltage $V_B$ that varies dependent on the resistance value $R_{TH1}$ of the thermistor 44 at the connection point of the resistors 66 and 67. The detection voltage $V_B$ thus generated is then inputted into the second comparator 64 of the body 60. The second comparator 64 generates the output signal $V_{COM2}$ having a logic value corresponding to the detection voltage $V_B$ thus inputted and then, sends the signal $V_{COM2}$ to the charging controller 62. Thus, the controller 62 controls the turn on and off operation of the switch 61 according to the signal $V_{COM2}$ from the second comparator 64.

When the cell 43 of the first battery pack 40 is excessively charged, the temperature of the cell 43 rises and the resistance $R_{TH1}$ of the thermistor 44 decreases. Thus, the temperature detection voltage $V_D$ at the connection point of the resistors 66 and 67 lowers. The second comparator 64 compares the value of the detection voltage $V_D$ with the predetermined threshold value and then, outputs the output signal $V_{COM2}$ having a specific logic value if the value of the detection voltage $V_D$ is equal to or less than its threshold value. As a result, the charging controller 62 turns the switch 61 off to stop the charging operation toward the first battery pack 40.

Next, the operation of the conventional mobile phone having the second battery pack 50 is explained with reference to FIG. 5.

FIG. 5 shows the configuration of the conventional mobile phone with the second battery pack 50, in which the power supply terminal 501, the discrimination terminal 502, the temperature detection terminal 503, and the ground terminal 504 of the second battery pack 50 are connected to the power supply terminal 601, the discrimination terminal 602, the temperature detection terminal 603, and the ground terminal 604 of the phone body 60, respectively.

When the phone body 60 is in its normal operation, the power supply terminal 601 is supplied with the second battery voltage $V_{BAT2}$ of the second battery pack 50. The second battery voltage $V_{BAT2}$ thus supplied is then supplied to the power supply IC 70, generating the specific inner-circuit voltages will specific values. These inner-circuit voltages are respectively sent to the inner circuit blocks or the phone body 60, such as the radio section, the display section, and the control section. This is the same as that of the first battery pack 40.

The second battery voltage $V_{BAT2}$ supplied by the second pack 50 is divided by the resistor 55 of the pack 50 and the resistors 68 and 69 of the body 60, generating a second discrimination voltage $V_A'$ at the connection point of the resistors 68 and 69. The second discrimination voltage $V_A'$, which has a higher value than the first discrimination voltage $V_A$, is inputted into the first comparator 63. The first comparator 63 generates the output signal $V_{COM1}$ having a logic value corresponding to the value of the discrimination voltage $V_A'$ thus inputted and then, sends the output signal $V_{COM1}$ to the charging controller 62 of the phone body 60. According to the output signal $V_{COM1}$ thus sent, the controller 62 recognizes that the second battery pack 50 is connected to the body 60.

The charging operation is approximately the same as that using the first battery pack 40. Specifically, when the phone body 60 is in its charging operation, a specific charging apparatus (not shown) is connected across the charge input terminal 605 and the ground terminal 606. Thus, a charge current $I_{CHG}$ is supplied to the body 60 through the terminal 605. Part of the current $I_{CHG}$ is sent to the charge controller 62 as the control current $I_{CON}$, thereby generating the charge voltage $V_{CHG}$ at the connection point of the switch 61 and the diode 65 in the body 60. As explained above, the controller 62 is recognized that second battery pack 50 has been connected to the body 60 and therefore, the controller 62 controls the value of the control current $I_{CON}$ to thereby adjust the value of the charge voltage $V_{CHG}$ according to the charge characteristic of the battery cell 53.

The charge voltage $V_{CHG}$ thus generated is outputted through the power supply terminal 601 by way of the switch 61 and then, is supplied to the battery cell 53 of the second pack 50 by way of the power supply terminal 501 and the switch 51. As a result, a specific current flows to the cell 53 to charge the same.

The diode 65 of the body 60 serves to prevent the reverse current from flowing toward the charge apparatus from the cell 53.

During the charging operation, the charging voltage $V_{CHG}$ is divided by the thermistor 54 of the pack 50 and the resistors 66 and 67 of the body 60, thereby generating the temperature detection voltage $V_B'$ that varies dependent on the resistance value $R_{TH2}$ of the thermistor 54 at the connection point of the resistors 66 and 67. The detection voltage $V_B'$ thus generated is inputted into the second comparator 64 of the body 60. The second comparator 64 generates the output signal $V_{COM2}$ having a logic value corresponding to the voltage $V_B'$ thus inputted and then, sends the signal $V_{COM2}$ to the charging controller 62. Thus, the controller 62 controls the turn on and off operation of the switch 61 according to the signal $V_{COM2}$ from the second comparator 64.

When the cell 53 of the second battery pack 50 is excessively charged, the temperature of the cell 53 rises and the resistance of the thermistor 54 decreases. Thus, the temperature detection voltage $V_B'$ at the connection point of the resistors 66 and 67 decreases. The second comparator 61 compares the value of the detection voltage $V_B'$ with the predetermined threshold value and then, outputs the output signal $V_{COM2}$ having a specific logic value if the value of the detection voltage $V_B'$ is equal to or less than its threshold value. As a result, the charging controller 62 turns the switch 61 off to stop the charging operation toward the second battery pack 50.

As explained above in detail, with the conventional mobile phone shown in FIGS. 1 to 5, the phone body 60 can recognize whether the first or second battery pack 40 or 50 is connected thereto according to the discrimination voltage $V_A$ or $V_A'$ generated at the connection point of the resistors 68 and 69, i.e., the discrimination terminal 602. Also, the value of the charging voltage $V_{CHG}$ is adjusted or controlled to be proper for the charging characteristic of the battery pack 40 or 50 recognized.

However, to discriminate between the first and second packs 40 and 50, the discrimination-dedicated terminals 402, 502, and 602 are essentially provided respectively in the first and second packs 40 and 50 and the phone body 60. Thus, there arises a problem that the count of necessary terminals is large and therefore, the mobile phone is unable or difficult to be made more compact and light-weight.

SUMMARY OF THE INVENTION

Accordingly, an object of the present invention is to provide a method of detecting the type of a battery pack in a mobile electronic device that detects the type of a battery pack connected in a mobile electronic device even if no dedicated terminals are provided to a battery pack.

Another object of the present invention is to provide a mobile electronic device capable of detecting the type of a battery pack connected even if no dedicated terminals are provided to a battery pack.

Still another object of the present invention is to provide a method of detecting the type of a battery pack in a mobile electronic device that makes the device more compact and more light-weight easily.

A further object of the present invention is to provide a mobile electronic device that can be easily made more compact and more light-weight.

The above objects together with others not specifically mentioned will become clear to those skilled in the art from the following description.

According to a first aspect of the present invention, a method of detecting the type of a battery pack in a mobile electronic device is provided, which comprises the steps of:

(a) providing a first battery pack connectable to a body of a mobile electronic device;

the first battery pack having a battery cell, a first terminal connected to a high-potential side terminal of the cell, a second terminal connected to a low-potential side terminal of the cell, a third terminal, and a temperature detection element connected across the second and third terminals;

(b) providing a second battery pack connectable to the body of the device;

the second battery pack being different in characteristic from the first battery pack;

the second battery pack having a battery cell, a first terminal connected to a high-potential side terminal of the cell, a second terminal connected to a low-potential side terminal of the cell, a third terminal, and a temperature detection element connected across the first and second terminals;

(c) providing the body of the device with a fourth terminal connectable to the first terminal of the first or second battery pack, a fifth terminal connectable to the second terminal of the first or second battery pack, a sixth terminal connectable to the third terminal of the first or second battery pack;

the body of the device having a resistive voltage divider circuit connected among the fourth, fifth, and sixth terminals;

(d) connecting the first or second battery pack to the body of the device in such a way that the fourth, fifth, and sixth terminals of the body of the device are connected to the first, second, and third terminals of the first or second battery pack, respectively;

(e) detecting an output voltage of the resistive voltage divider of the body of the device, generating a detection result; and (f) judging whether the first or second battery pack is connected to the body of the device base on the detection result.

With the method of detecting the type of a battery pack in a mobile electronic device according to the first aspect of the invention, the first and second battery packs connectable to the body of the mobile electronic device are provided. Each of the first and second packs has the battery cell, the first terminal connected to the high-potential side terminal of the cell, the second terminal connected to the low-potential side terminal of the cell, the third terminal, and the temperature detection element connected across the second and third terminals.

On the other hand, the body of the device is provided with the fourth terminal connectable to the first terminal of the first or second battery pack, the fifth terminal connectable to the second terminal of the first or second battery pack, the sixth terminal connectable to the third terminal of the first or second battery pack. The body of the device further has the resistive voltage divider circuit connected among the fourth, fifth, and sixth terminals.

When the first or second battery pack is connected to the body of the device in such a way that the fourth, fifth, and sixth terminals of the body of the device are connected to the first, second, and third terminals of the first or second battery pack, respectively, the output voltage of the resistive voltage divider is detected, generating the detection result. Thereafter, it is judged whether the first or second battery pack is connected to the body of the device based on the detection result.

Because the temperature detection element is connected across the second and third terminals in the first battery pack while the temperature detection element is connected across the first and second terminals in the second battery pack, the content of the detection result varies according to whether the first or second battery pack is connected to the body of the device.

Accordingly, the fact whether the first or second battery pack is connected to the body of the device can be detected (i.e., recognized). Thus means that the type of the first or second battery pack can be discriminated even if no dedicated terminals are provided to the first and second battery packs. Thus, the mobile electronic device can be made more compact and more light-weight easily.

In a preferred embodiment of the method according to the first aspect of the invention, each of the first and second battery packs comprises a circuit for detecting whether or not the battery cell is in its normal condition; and a switch for stopping an output of the battery cell if the battery cell is not in its normal condition.

In another preferred embodiment of the method according to the first aspect of the invention, the body of the device comprises first, second, and third comparators having threshold values different from each other; and a discrimination circuit for discriminating between the first and second battery packs. The first, second, and third comparators compares the output of the resistive voltage-divider circuit with their threshold values, generating an comparison result signal to the discrimination circuit. The discrimination circuit discriminates between the first and second battery packs based on the comparison result signal.

In this embodiment, it is preferred that the comparison result signal is a combination of three logic signals from the first, second, and third comparators.

According to a second aspect of the present invention, a mobile electronic device is provided, which comprises:

(a) a first battery pack connectable to a body of a mobile electronic device;

the first battery pack having a battery cell, a first terminal connected to a high-potential side terminal of the cell, a second terminal connected to a low-potential side terminal of the cell, a third terminal, and a temperature detection element connected across the second and third terminals;

(b) a second battery pack connectable to the body;

the second battery pack being different in characteristic from the first battery pack;

the second battery pack having a battery cell, a first terminal connected to a high-potential side terminal of the cell, a second terminal connected to a low-potential side terminal of the cell, a third terminal, and a temperature detection element connected across the first and second terminals;

(c) the body of the mobile electronic device having a fourth terminal, a fifth terminal, a sixth terminal, and a resistive voltage divider circuit connected among the fourth, fifth, and sixth terminals;

the first terminal of the first or second battery pack being connectable to the fourth terminal of the body, the second terminal of the first or second battery pack being connectable to the fifth terminal of the body, the third terminal of the first or second battery pack being connectable to the sixth terminal of the body;

(d) an output voltage of the resistive voltage divider of the body being detected to generate a detection result, when the first or second battery pack is connected to the body in such a way that the fourth, fifth, and sixth terminals of the body are connected to the first, second, and third terminals of the first or second battery pack, respectively; and (e) whether the first or second battery pack is connected to the body is judged based on the detection result.

With the mobile electronic device according to the second aspect of the present invention, because of substantially the same reason as the method according to the first aspect of the invention, the fact that the first or second battery pack is connected to the body of the mobile electronic device can be detected (i.e., recognized) and discriminated without providing dedicated terminals for discriminating between the first and second battery packs.

Also, since no discrimination-dedicated terminals are required, the mobile electronic device according to the second embodiment can be easily made more compact and more light-weight.

In a preferred embodiment of the deice according to the second aspect of the invention, each of the first and second battery packs comprises a circuit for detecting whether or not the battery cell is in its normal condition; and a switch for stopping an output of the battery cell if the battery cell is not in its normal condition.

In another preferred embodiment of the device according to the second aspect of the invention, the body comprises first, second, and third comparators having threshold values different from each other; and a discrimination circuit for discriminating between the first and second battery packs. The first, second, and third comparators compares the output of the resistive voltage-divider circuit with their threshold values, generating an comparison result signal to the discrimination circuit. The discrimination circuit discriminates between the first and second battery packs based on the comparison result signal.

In this embodiment, it is preferred that the comparison result signal is a combination of three logic signals from the first, second, and third comparators.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
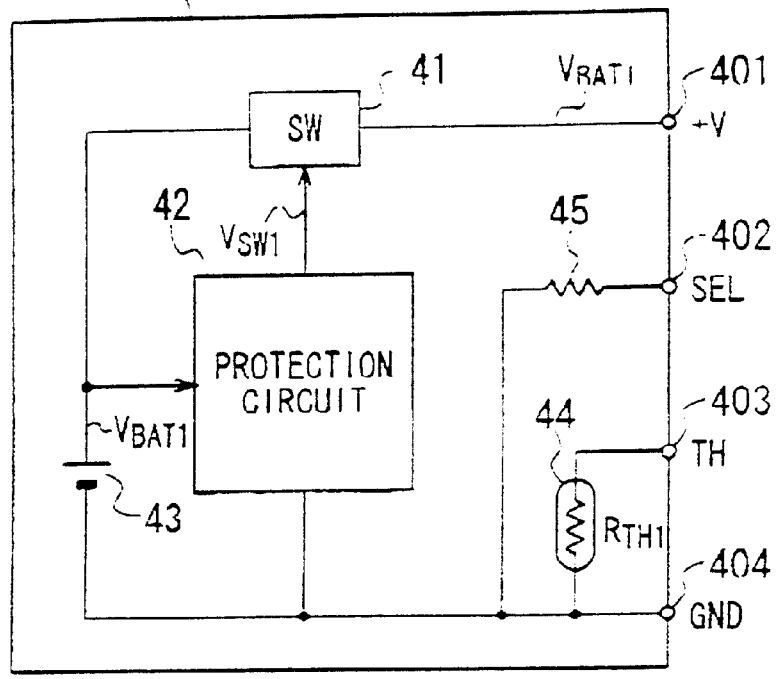
FIG. 1 is a schematic, partial circuit diagram showing the configuration of the first battery pack of a prior-art mobile phone.
Figure 2:
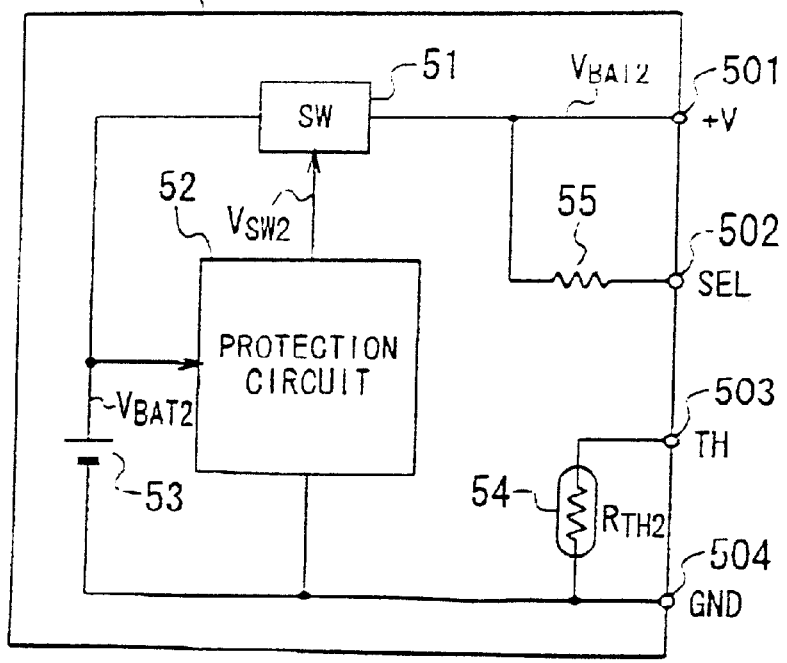
FIG. 2 is a schematic, partial circuit diagram showing the configuration of the second battery pack of the prior art mobile phone.
Figure 3:
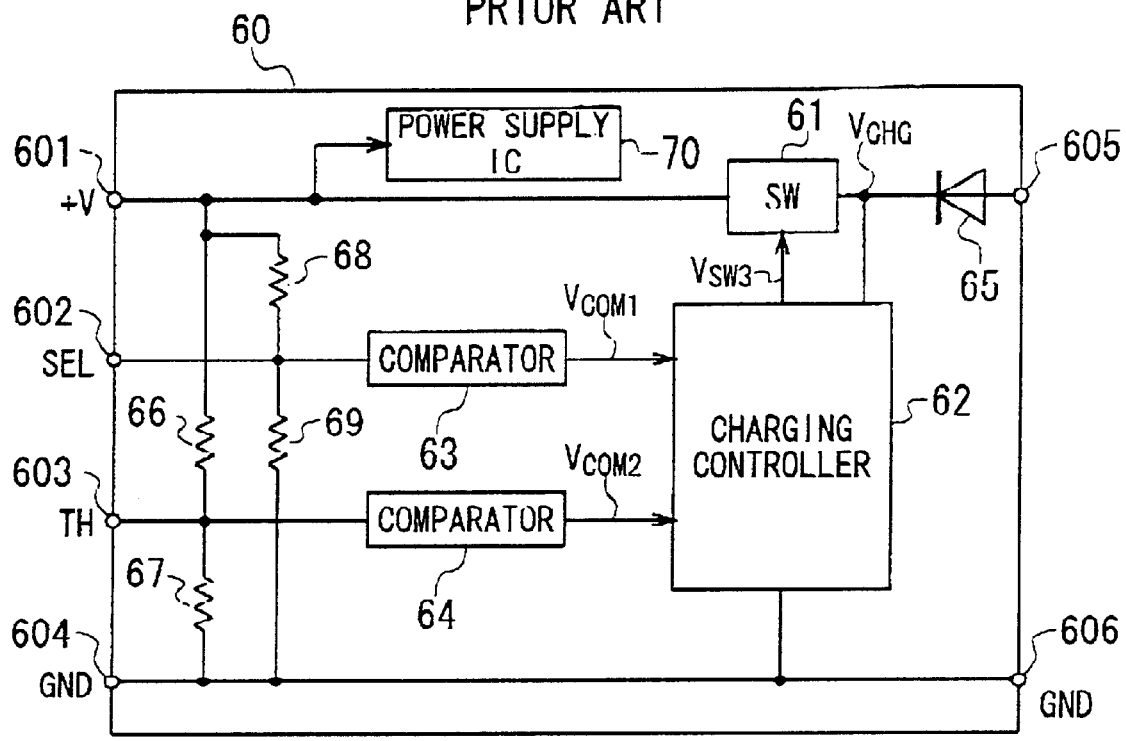
FIG. 3 is a schematic, partial circuit diagram showing the configuration of the body of the prior-art mobile phone.
Figure 4:
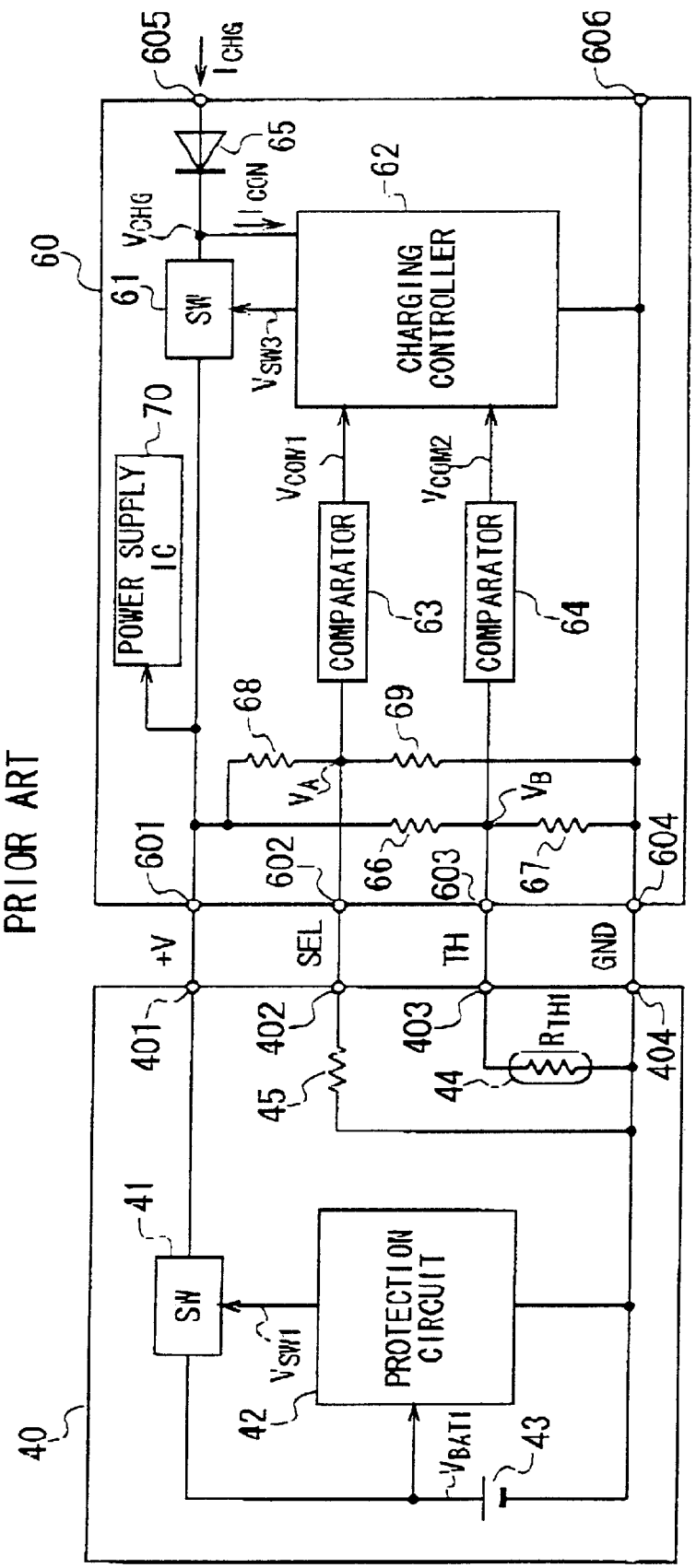
FIG. 4 is a schematic, partial circuit diagram showing the configuration of the prior-art mobile phone, in which the first battery pack is connected to the phone body.
Figure 5:
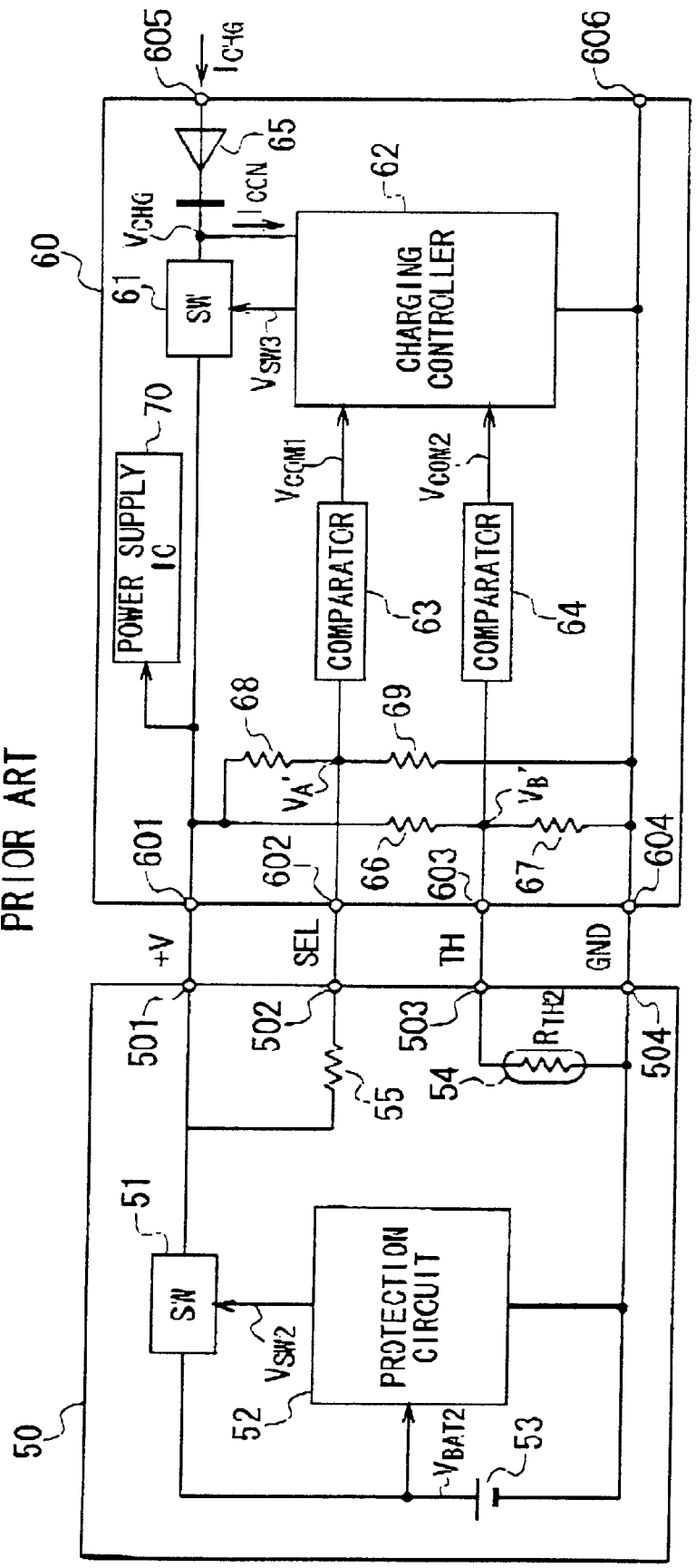
FIG. 5 is a schematic, partial circuit diagram showing the configuration of the prior-art mobile phone, in which the second battery pack is connected to the phone body.

Preferred embodiment of the present invention will be described in detail below while referring to the drawings attached.

Figure 6:
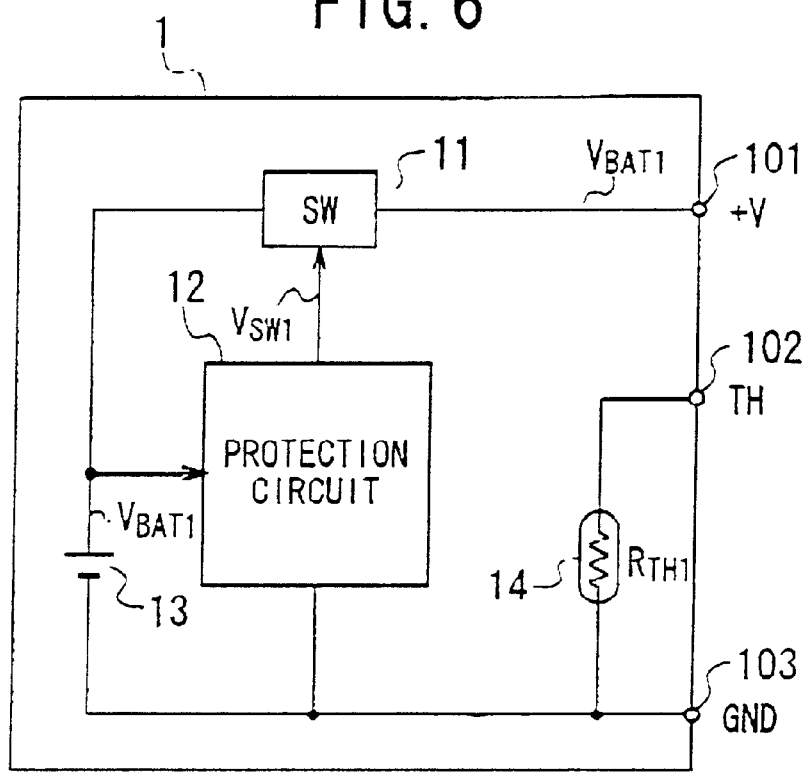
FIG. 6 is a schematic, partial circuit diagram showing the configuration of the first battery pack of a mobile phone according to an embodiment of the invention.
Figure 7:
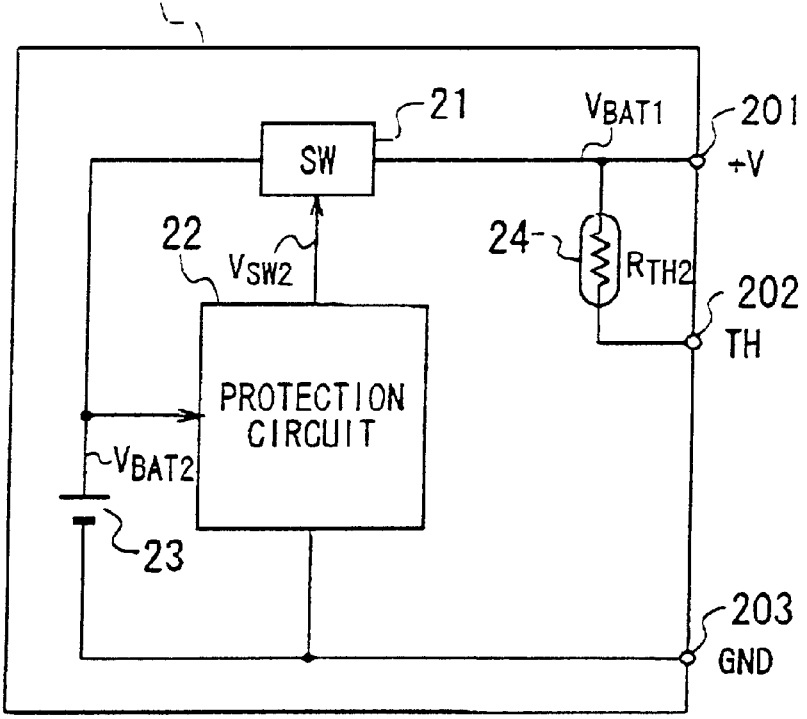
FIG. 7 is a schematic, partial circuit diagram showing the configuration of the second battery pack of the mobile point according to the embodiment of FIG. 6.
Figure 8:
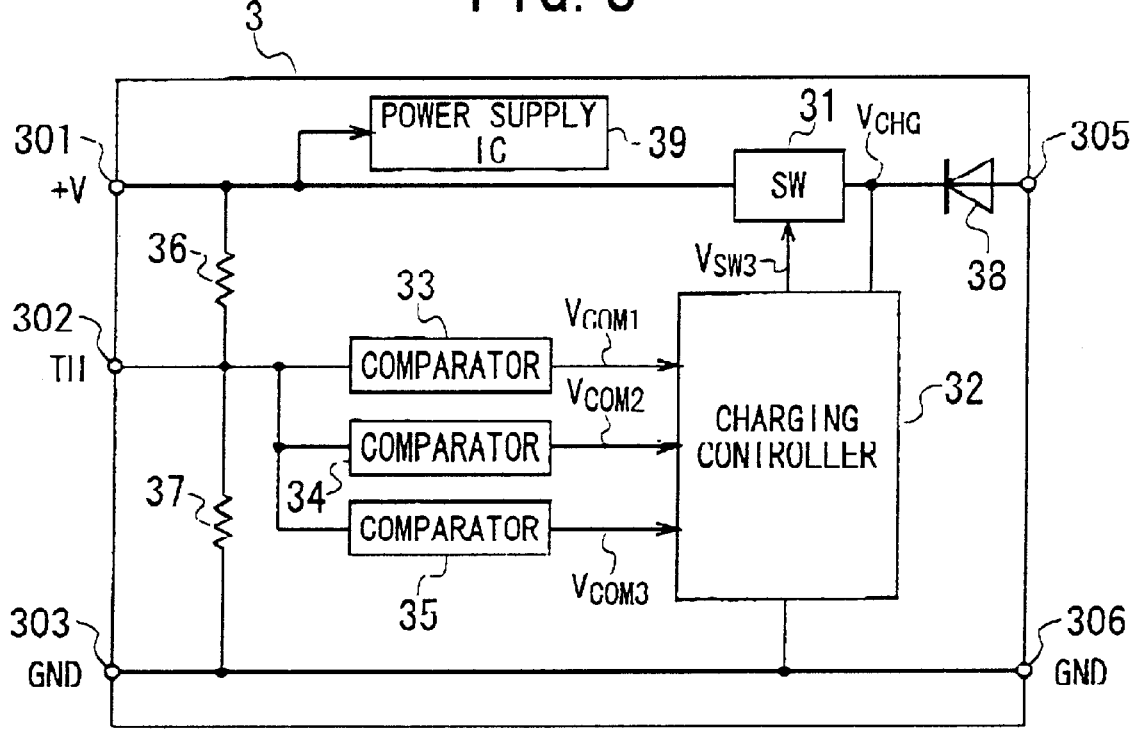
FIG. 8 is a schematic, partial circuit diagram showing the configuration of the body of the mobile phone according to the embodiment of FIG. 6.

A mobile phone according to an embodiment of the present invention is shown in FIGS. 6 to 8.

As shown in FIG. 6, a first battery pack 1 comprises a switch 11, a protection circuit 12, a Li-ion battery cell 18, a thermistor 14, a power-supply terminal (i.e., +V terminal) 101, a temperature detection terminal (i.e., TH terminal) 102, and a ground terminal (i.e., GND terminal) 103. The switch 11, the protection circuit 12, the cell 13, and the thermistor 14 are provided in the enclosure or casing (not shown) of the first battery pack 1. The power-supply terminal 101, the temperature detection terminal 102, and the around terminal 103 are exposed to the outside from the enclosure.

The positive terminal of the battery cell 13 is connected to the power supply terminal 101 by way of the switch 11. The negative terminal of the battery cell 13 is directly connected to the ground terminal 103. The first battery voltage $V_{BAT1}$, which is generated between the positive and negative terminals of the cell 43, is outputted from the power-supply and ground terminals 101 and 104.

The protection circuit 12 is supplied with the first battery voltage $V_{BAT1}$ from the cell 13. The circuit 12 generates the switch control signal $V_{SW1}$ on the basis of the battery voltage $V_{BAT1}$ and then, supplies the control signal $V_{SW1}$ thus generated to the switch 11. The ground terminal of the circuit 12 is connected to the ground terminal 103.

The switch 11 serves to connect the positive terminal of the first battery cell 13 to the power supply terminal 101 and disconnects the same from the terminal 101 according to the switch control signal $V_{CON1}$ from the protection circuit 12.

The thermistor 14 is connected to the temperature detection terminal 102 and the ground terminal 103. The thermistor 14 is located in the vicinity of the battery cell 13 to facilitate detection of the temperature of the cell 13.

With the first battery pack 1 having the above described configuration, the switch 11 is turned on or off by the control signal $V_{SW1}$ generated by the protection circuit 12, thereby controlling the output of the first battery voltage $V_{BAT1}$ through the power supply terminals 101 and 103. Specifically, in the normal operation state where the battery voltage $V_{BAT1}$ is equal to or higher than a specific value, the switch 11 is turned on by the control signal $V_{SW1}$, outputting the battery voltage $V_{BAT1}$ through the terminal 101. On the other hand, in the abnormal operation state where the battery voltage $V_{BAT1}$ is less than the specific value, the switch 11 is turned off by the control signal $V_{SW1}$, stopping the output of the battery voltage $V_{BAT1}$ through the terminals 101 and 103.

The resistance $R_{TH1}$ of the thermistor 44 varies according to the temperature of the battery cell 13. Thus, when a circuit generating a voltage corresponding to the resistance $R_{TH1}$ is connected to the temperature detection terminal 102, the temperature of the cell 13 can be detected on the basis of the voltage thus generated.

As explained later, the voltage corresponding to the resistance $R_{TH1}$ of the thermistor 44 becomes lower as the temperature of the cell 13 rises. Also, the voltage corresponding to the resistance $R_{TH1}$ can be set at a value equal to or greater than the specific threshold value. Accordingly, the first battery pack 1 can be recognized and discriminated by detecting the voltage corresponding to the resistance $R_{TH1}$.

FIG. 7 shows a second battery pack 2, which has approximately the same configuration as the first battery pack 1, except that a thermistor 24 corresponding to the thermistor 14 in the first pack 1 is connected across a power supply terminal 201 and a temperature detection terminal 202.

Specifically, as shown in FIG. 7, the second battery pack 2 comprises a switch 21, a protection circuit 22, a Li-ion battery cell 23, a thermistor 24, a power-supply terminal 201, a temperature detection terminal 202, and a ground terminal 203. The switch 21, the protection circuit 22, the cell 23, and the thermistor 24 are provided in the enclosure (not shown) of the second battery pack 2. The power-supply terminal 201, the temperature detection terminal 202, and the ground terminal 203 are exposed to the outside from the enclosure.

The battery cell 23 is different in characteristics from the battery cell 13 of the first battery pack 1. The positive terminal of the battery cell 23 is connected to the power-supply terminal 201 by way of the switch 21. The negative terminal of the battery cell 23 is directly connected to the ground terminal 203. The second battery voltage $V_{BAT2}$, which is generated across the positive and negative terminals of the cell 23, is outputted from the terminal 201 by way of the switch 21.

The protection circuit 22 is supplied with the second battery voltage $V_{BAT2}$ from the cell 23. The circuit 22 generates the switch control signal $V_{SW2}$ on the basis of the battery voltage $V_{BAT2}$ and then, supplies the control signal $V_{SW2}$ thus generated to the switch 21. The ground terminal of the circuit 22 is connected to the ground terminal 203.

The switch 21 serves to connect the positive terminal of the second battery cell 23 to the power supply terminal 201 and disconnects the same from the terminal 201 according to the switch control signal $V_{SW2}$ from the protection circuit 22.

Unlike the thermistor 14 in the first battery pack 1, the thermistor 24 is connected across the temperature detection terminal 202 and the ground terminal 203. The thermistor 24 is located in the vicinity of the battery cell 23 to facilitate detection of the temperature of the cell 23.

With the second battery pack 2 having the above-described configuration, the switch 21 is turned on or off by the control signal $V_{SW2}$ generated by the protection circuit 22, thereby controlling the output of the second battery voltage $V_{BAT2}$ from the power-supply and ground terminals 201 and 203. Specifically, in the normal operation state where the second battery voltage $V_{BAT2}$ is equal to or higher than a specific value, the switch 21 is turned on by the control signal $V_{SW2}$, outputting the battery voltage $V_{BAT2}$ through the terminals 201 and 203. On the other hand, in the abnormal operation state where the voltage $V_{BAT2}$ is less than the specific value, the switch 21 is turned off by the control signal $V_{SW2}$, stopping the output of the voltage $V_{BAT2}$ through the terminals 201 and 203.

Similar to the first battery pack 1 shown in FIG. 6, the resistance $R_{TH2}$ of the thermistor 24 varies according to the temperature of the battery cell 23. Thus, when a circuit generating a voltage corresponding to the resistance $R_{TH2}$ is connected to the temperature detection terminal 202, the temperature of the cell 23 can be detected on the basis of the voltage thus generated.

As explained later, the voltage corresponding to the resistance $R_{TH2}$ of the thermistor 24 becomes lower as the temperature of the cell 23 rises. Also, the voltage corresponding to the resistance $R_{TH2}$ can be set at a value equal to or greater than the specific threshold value. Accordingly, the second battery pack 2 can be recognized and discriminated by detecting the voltage corresponding to the resistance $R_{TH2}$.

Subsequently, the body of the mobile phone according to the embodiment of the invention, i.e., the phone body 3, is explained below with reference to FIG. 8.

The phone body 3 comprises a switch 31, a charge control section 32, three comparators 33, 34, and 35, two resistors 36 and 37, a diode 38 for stopping the reverse current, a power supply terminal 301, a temperature detection terminal 302, two ground terminals 303 and 306, and a charge input terminal 305. The switch 31, the charge control section 32, the comparators 33, 34, and 35, the resistors 36 and 37, and the diode 38 are provided in the enclosure (not shown) of the body 3. The power supply terminal 301, the temperature detection terminal 302, the ground terminals 303 and 306, and the charge input terminal 305 are exposed to the outside from the enclosure. The ground terminal 303 is used for connection of the first and second battery packs 1 and 2, respectively. The ground terminal 306 is used for connection of a specific charging apparatus.

The power supply terminal 301 is connected to the ground terminals 303 and 306 by way of the serially-connected resistors 36 and 37 and to the charge input terminal 305 by way of the switch 31 and the diode 38. The terminal 301 is further connected to a power supply IC 39 with specific control functions incorporated into the inside of the body 3.

The temperature detection terminal 302 is connected to the connection point of the resistors 36 and 37 and is connected to common to the input terminals of the first, second, and third comparators 33, 34, and 35. The resistors 36 and 37 serve as a pull-up resistor and a pull-down resistor for the terminal 302, respectively. Those comparators 33, 34, and 35 produce first, second, and third output signals $V_{COM1}$, $V_{COM2}$, and $V_{COM3}$, respectively, and supplies them to the charging controller 32.

The charging controller 32 is connected between the cathode of the diode 38 and the ground terminal 306. The charging controller 32 receives the first to third control signals $V_{COM1}$, $V_{COM2}$, and $V_{COM3}$ outputted respectively from the first to third comparators 33, 34, and 35 and discriminates whether the first or second battery pack 1 or 2 is connected to the body 3. Also, the controller 32 adjusts the charge voltage $V_{CHG}$ at the connection point of the switch 31 and the diode 38 according to the charging characteristic of the pack 1 or 2 connected. Moreover, the controller 32 generates the control signal $V_{SW3}$ to the switch 31 according to the control signals $V_{COM1}$, $V_{COM2}$, and $V_{COM3}$ from the first to third comparators 33, 34, and 35.

The switch 31 serves to connect the diode 38 to the power supply terminal 301 or disconnect the same from the terminal 301 according to the control signal $V_{SW3}$ from the controller 32.

One of the first and second battery packs 1 and 2 is alternately connected to the phone body 3, constituting the mobile phone according to the embodiment of the invention. The operation of the phone having the first or second battery pack 1 or 2 connected is explained below.

Figure 9:
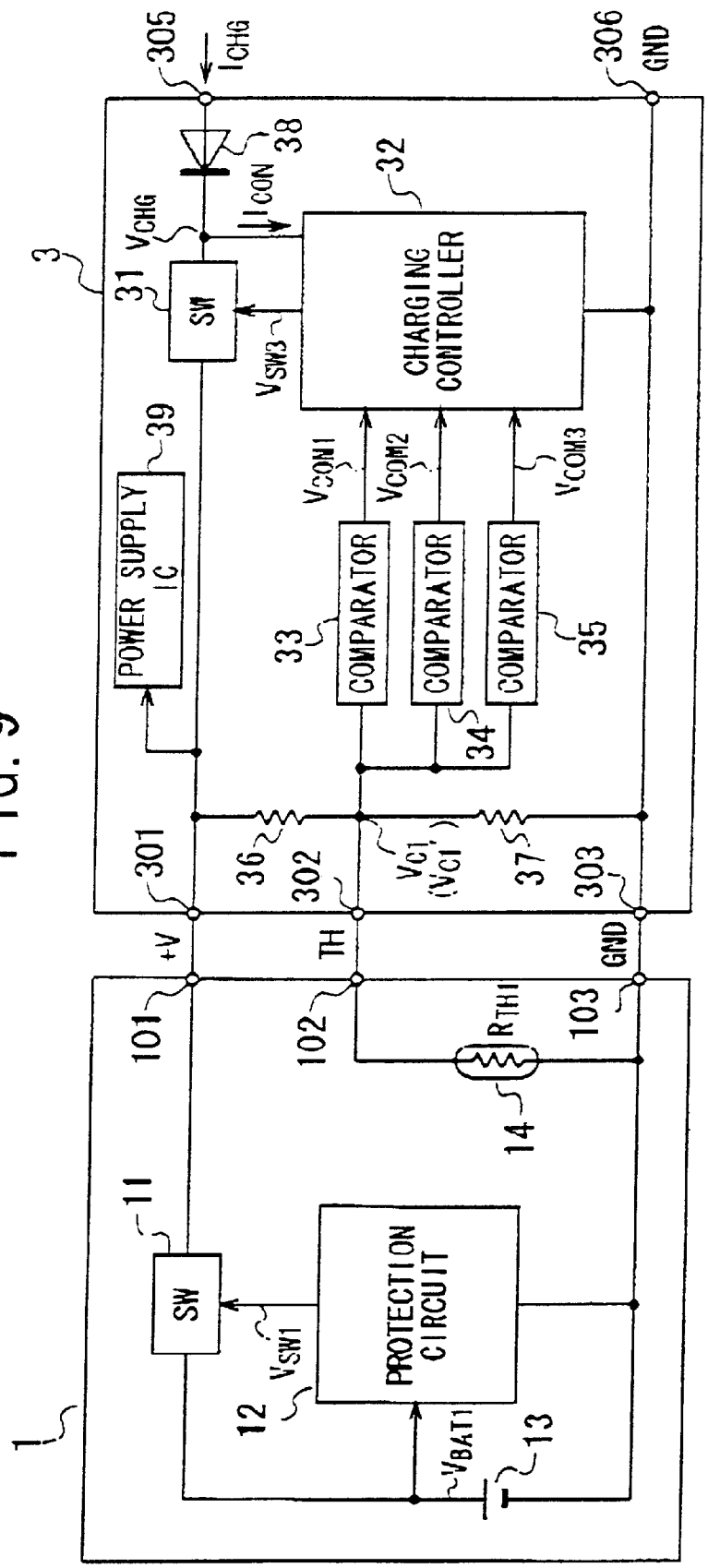
FIG. 9 is a schematic, partial circuit diagram showing the configuration of the mobile phone according to the embodiment of the invention, in which the first battery pack shown in FIG. 6 is connected to phone body shown in FIG. 8.

FIG. 9 shows the configuration of the mobile phone having the first battery pack 1, in which the power supply terminal 101, the temperature detection terminal 102, and the ground terminal 103 of the first battery pack 1 are connected to the power supply terminal 301, the temperature detection terminal 302, and the ground terminal 303 of the phone body 3, respectively.

When the phone body 3 is in its normal operation, the first battery voltage $V_{BAT1}$ of the first pack 1 is supplied across the power supply terminal 301 and the ground terminal 303. The first battery voltage $V_{BAT1}$ thus supplied is then supplied to the power supply IC 39, generating specific inner-circuit voltages with specific values. These inner-circuit voltages thus generated are respectively sent to the inner circuit blocks of the phone body 3, such as the radio section, the display section, and the control section.

The first battery voltage $V_{BAT1}$ supplied by the first pack 1 is divided by the thermistor 14 of the pack 1 and the resistors 36 and 37 of the body 3, generating a first temperature detection voltage $V_{C1}$ at the connection point of the resistors 36 and 37 (i.e., at the temperature detection terminal 302). The temperature detection voltage $V_{C1}$ thus generated is inputted commonly into the first to third comparators 33, 34, and 35.

The first, second, and third comparators 33, 34, and 35 compare the first temperature detection voltage $V_{C1}$ thus inputted with their predetermined threshold voltages $V_{TH1}$, $V_{TH2}$, and $V_{TH3}$, respectively. When the inputted detection voltage $V_{C1}$ is greater than the threshold voltage $V_{TH1}$, $V_{TH2}$, or $V_{TH3}$, the comparators 33, 34, and 35 produce the output signals $V_{COM1}$, $V_{COM2}$, and $V_{COM3}$ with logic high (H) values and send them to the charging controller 32 of the phone body 3, respectively. When the inputted voltage $V_{C1}$ is less than the threshold voltage $V_{TH1}$, $V_{TH2}$, or $V_{TH3}$, the comparators 33, 34, and 35 produce the output signals $V_{COM1}$, $V_{COM2}$, and $V_{COM3}$ with logic low (L) values and send them to the charging controller 32, respectively. According to these output signals $V_{COM1}$, $V_{COM2}$, and $V_{COM3}$ thus sent, the charging controller 62 recognizes that the first battery pack 1 is connected to the body 3.

On the other hand, when the phone body 3 is in its charging operation, a specific charging apparatus (not shown) is connected across the charge input terminal 305 and the ground terminal 306. Thus, a charging current $I_{CHG}$ is supplied to the body 3 through the terminal 305. Part of the charging current $I_{CHG}$ is sent to the charging controller 32 as control current $I_{CON}$, thereby generating the charging voltage $V_{CHG}$ at the connection point of the switch 31 and the diode 38 in the body 3. As explained above, the controller 32 has recognized that the first battery pack 1 has been connected to the body 3 and therefore, the controller 32 controls the value of the control current $I_{CON}$ to thereby adjust the value of the charging voltage $V_{CHG}$ according to the charging characteristic of the battery cell 13 of the first pack 1.

The charging voltage $V_{CHG}$ thus generated is outputted from the terminals 301 and 303 of the body 3 by way of the switch 31 and then, is supplied to the battery cell 13 of the first pack 1 by way of the terminals 101 and 103 and the switch 11 of the pack 1. As a result, a specific current flows to the cell 13 to charge the same.

Additionally, the diode 36 of the body 3 serves to prevent the reverse current from flowing toward the charge apparatus from the cell 13.

During the charging operation, the charging voltage $V_{CHG}$ is divided by the thermistor 14 of the pack 1 and the resistors 36 and 37 of the body 3, thereby generating the temperature detection voltage $V_{C1}'$ that varies dependent on the resistance value of the thermistor 14 at the connection point of the resistors 36 and 37 (i.e., the temperature detection terminal 302). The temperature detection voltage $V_{C1}'$ thus generated is commonly inputted into the first to third comparators 33, 34, and 35 of the body 3. The first, second, and third comparators 33, 34, and 35 generate the output signals $V_{COM1}$, $V_{COM2}$, and $V_{COM3}$ having a logic value L or H corresponding to the result of comparison between the detection voltage $V_{C1}'$ and the threshold voltage $V_{TH1}$, $V_{TH2}$, or $V_{TH3}$ and then, it sends the output signals $V_{COM1}$, $V_{COM2}$, and $V_{COM3}$ to the charging controller 32. Thus, the controller 32 judges whether the cell 13 of the first battery pack 1 is excessively charged or not according to the output signals $V_{COM1}$, $V_{COM2}$, and $V_{COM3}$. If the controller 32 judges that the cell 13 is excessively charged, the controller 32 turns the switch 31 off immediately, thereby stopping the charging operation to the first pack 1.

Next, the operation of the portable telephone having the second battery pack 2 is explained with reference to FIG. 10.

Figure 10:
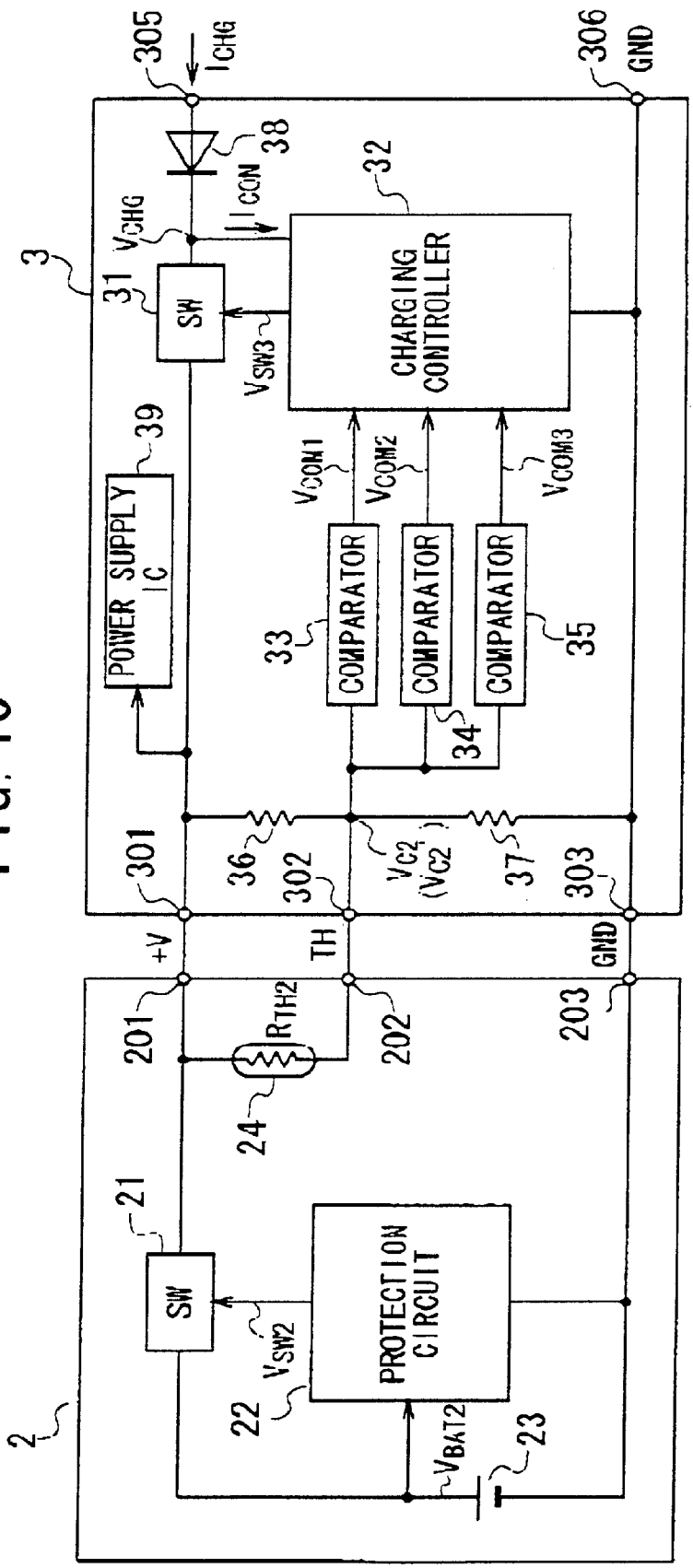
FIG. 10 is a schematic, partial circuit diagram showing the configuration of the portable telephone according to the embodiment of the invention, in which the second battery pack shown in FIG. 7 is connected to the phone body shown in FIG. 8.

FIG. 10 shows the configuration of the mobile phone having the second battery pack 2, in which the power supply terminal 201, the temperature detection terminal 202, and the ground terminal 203 of the second battery pack 2 are connected to the power supply terminal 301, the temperature detection terminal 302, and the ground terminal 303 of the phone body 3, respectively.

The operation of the portable telephone using the second pack 2 is approximately the same as that using the first pack 1.

Specifically, when the phone body 3 is in its normal operation, the second battery voltage $V_{BAT2}$ of the second pack 2 is supplied across the power supply terminal 301 and the ground terminal 303. The second battery voltage $V_{BAT2}$ thus supplied is then supplied to the power supply IC 39, generating specific inner-circuit voltages with specific values. These inner-circuit voltages thus generated are respectively sent to the inner circuit blocks of the phone body 3, such as the radio section, the display section, and the control section.

The second battery voltage $V_{BAT2}$ supplied by the second pack 2 is divided by the thermistor 24 of the pack 2 and the resistors 36 and 37 of the body 3, generating a second temperature detection voltage $V_{C2}$ at the connection point of the resistors 36 and 37 (i.e., at the temperature detection terminal 302). The temperature detection voltage $V_{C2}$ thus generated is inputted commonly into the first to third comparators 33, 34, and 35.

The first, second, and third comparators 33, 34, and 35 compare the second temperature detection voltage $V_{C2}$ thus inputted with their predetermined threshold voltages $V_{TH1}$, $V_{TH2}$, and $V_{TH3}$, respectively. When the inputted detection voltage $V_{C2}$ is greater than the threshold voltage $V_{TH1}$, $V_{TH2}$, or $V_{TH3}$, the comparators 33, 34, and 35 produce the output signals $V_{COM1}$, $V_{COM2}$, and $V_{COM3}$ with logic H values and send them to the charging controller 32 of the phone body 3, respectively. When the inputted voltage $V_{C2}$ is less than the threshold voltage $V_{TH1}$, $V_{TH2}$, or $V_{TH3}$, the comparators 33, 34, and 35 produce the output signals $V_{COM1}$, $V_{COM2}$, and $V_{COM3}$ with logic L values and send them to the charging controller 32, respectively. According to these output signals $V_{COM1}$, $V_{COM2}$, and $V_{COM3}$ thus sent, the charging controller 32 recognizes that the second battery pack 2 is connected to the body 3.

On the other hand, when the phone body 3 is in its charging operation, a specific charging apparatus (not shown) is connected across the charge input terminal 305 and the ground terminal 306. Thus, a charging current $I_{CHG}$ is supplied to the body 3 through the terminal 305. Part of the charging current $I_{CHG}$ is sent to the charging controller 32 as a control current $I_{CON}$, thereby generating the charging voltage $V_{CHG}$ at the connection point of the switch 31 and the diode 38 in the body 2. As explained above, the controller 32 has recognized that second battery pack 2 has been connected to the body 3 and therefore, the controller 32 controls the value of the control current $I_{CON}$ to thereby adjust the value of the charging voltage $V_{CHG}$ according to the charging characteristic of the battery cell 23 of the second pack 2.

The charging voltage $V_{CHG}$ thus generated is outputted from the terminals 301 and 303 of the body 3 by way of the switch 31 and then, it supplied to the battery cell 23 of the second pack 2 by way of the terminals 201 and 203 and the switch 21 of the pack 2. As a result, a specific current flows to the cell 23 to charge the same.

During the charging operation, the charging voltage $V_{CHG}$ is divided by the thermistor 24 of the pack 2 and the resistors 36 and 37 of the body 3, thereby generating the temperature detection voltage $V_{C2}'$ that varies dependent on the resistance value of the thermistor 24 at the connection point of the resistors 36 and 37 (i.e., the temperature detection terminal 302). The temperature detection voltage $V_{C2}'$ thus generated is commonly inputted into the first to third comparators 33, 34, and 35 of the body 3. The first, second, and third comparators 33, 34, and 35 generate the first, second, and third output signals $V_{COM1}$, $V_{COM2}$, and $V_{COM3}$ having a logic value L or H corresponding to the result of comparison between the voltage $V_{C2}'$ and the threshold voltage $V_{TH1}$, $V_{TH2}$, or $V_{TH3}$ and then, it sends the output signals $V_{COM1}$, $V_{COM2}$, and $V_{COM3}$ to the charging controller 32. Thus, the controller 32 judges whether the cell 23 of the second battery pack 2 is excessively charged or not according to the output signals $V_{COM1}$, $V_{COM2}$, and $V_{COM3}$. If the controller 32 judges that the cell 23 is excessively charged, the controller 32 turns the switch 31 off immediately, thereby stopping the charging operation to the second pack 2.

Next, the operation of the first to third comparators 33, 34, and 35 and the charging controller 32 of the phone body 3 is explained in detail below with reference to FIG. 11.

Figure 11:
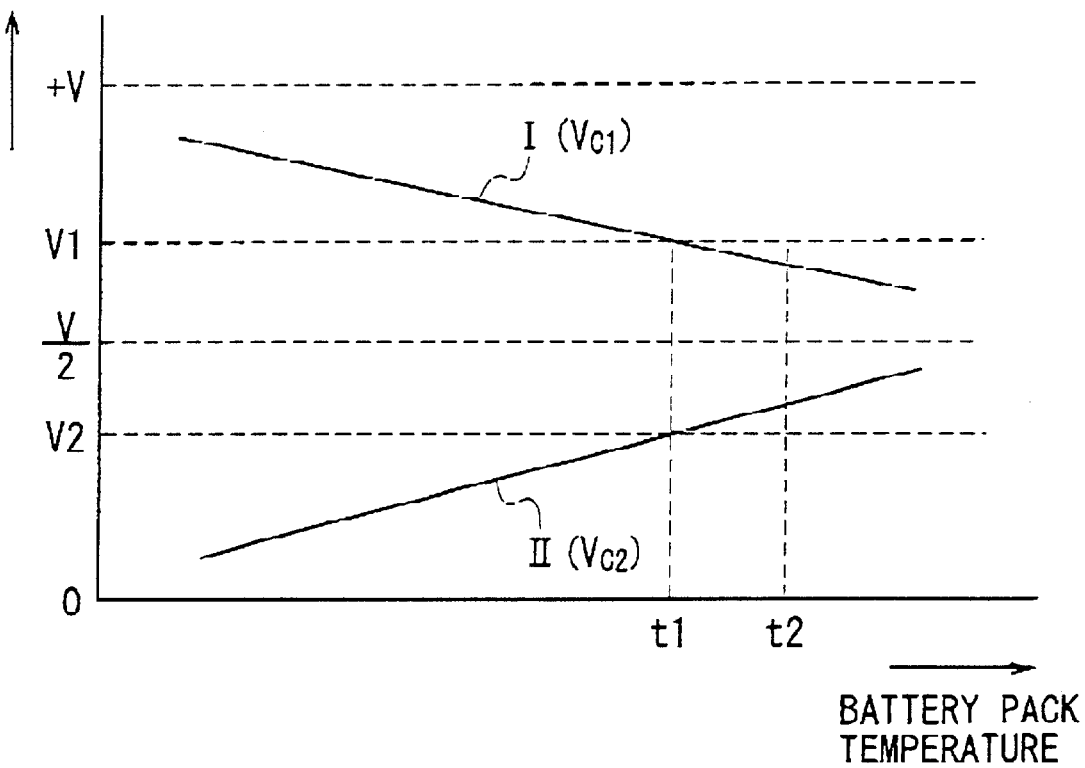
FIG. 11 is a graph showing the relationship between the temperature detection voltage and the temperature of the first or second battery pack in the mobile phone according to the embodiment of the invention.

FIG. 11 shows the relationship between the temperature of the first and second battery packs 1 and 2 (i.e., the battery cells 13 and 23) and the first and second temperature detection voltages $V_{C1}$ and $V_{C2}$, in which the ordinate and abscissa denotes the temperature detection voltage and the battery pack temperature, respectively.

The curve I in FIG. 11 shows the change of the temperature detection voltage when the first battery pack 1 is connected to the body 3. The curve II in FIG. 11 shows the same change when the second battery pack 2 is connected to the body 3.

Here, for the sake of simplification of description, it is supposed that the first and second battery voltages $V_{BAT1}$ and $V_{BAT2}$ of the battery packs 1 and 2 and the charging voltage $V_{CHG}$ are equal to a specific voltage value V (i.e., $V_{BAT1}=V_{BAT2}=V_{CHG}=v$). In other words, it is supposed that the first temperature detection voltages $V_{C1}$ and $V_{C1}'$ are equal to the second temperature detection voltages $V_{C2}$ and $V_{C2}'$ (i.e., $V_{C1}=V_{C1}'=V_{C2}=V_{C2}'$).

The temperature t1 shown in FIG. 11 is determined to ensure the safety of users with respect to the first and second battery packs 1 and 2. The phone body 3 turns the switch 36 off to stop the charging operation if the battery pack temperature exceeds the temperature t1. The temperature t2 shown in FIG. 11 is the upper limit temperature that assures the normal operation of the body 3.

The value of the first temperature detection voltage $V_{C1}$ of the first pack 1 at the temperature t1 is defined as v1 and the value of the second temperature detection voltage $V_{C2}$ of the second pack 2 at the temperature t1 is defined as V2. Moreover, the second temperature detection voltage $V_{C3}$ is adjusted not to be greater than the voltage (V/2) at the temperature t2. The first temperature detection voltage $V_{C1}$ is adjusted not to be less than the voltage (V/2) at the temperature t2.

the resistance values of the thermistors 14 and 24 of the first and second packs 1 and 2 and the pull-up and pull-down resistors 36 and 37 of the phone body 3 are determined so as to satisfy the relationship between the temperature of the battery packs 1 and 2 and the temperature detection voltages $V_{C1}$ and $V_{C2}$. On the other hand, the values of the threshold voltages $V_{TH1}$, $V_{TH2}$, and $V_{TH3}$ of the first, second, and third comparators 33, 34, and 35 are set at V1, V2, and (V/2), respectively.

When the first battery pack 1 is connected to the phone body 3, the mobile phone according to the embodiment of the invention operates in the following way.

The thermistor 14 of the pack 1 has a semiconductor resistive element having a negative temperature coefficient and therefore, the resistance value of the thermistor 14 decreases as the temperature rises. Thus, the resistance value of the thermistor 14 is large within the lower temperature range where the temperature of the pack 1 is lower than t1. Accordingly, the first temperature detection voltages $V_{C1}$ (i.e., the divided voltage by the resistive voltage-divider circuit comprising the thermistor 14 and the resistors 36 and 37) is high.

As a result, as shown by the curve I in FIG. 11, the first temperature detection voltage $V_{C1}$ varies within the range from V to V1 when the temperature of the first pack 1 is equal to or less than t1. In this case, the first temperature detection voltage $V_{C1}$ is equal to or higher than all the threshold voltages $V_{TH1}$, $V_{TH2}$, and $V_{TH3}$ of the first to third comparators 33, 34, and 35 and thus, all the first to third output voltages $V_{COM1}$, $V_{COM2}$, and $V_{COM3}$ of the comparators 33, 34, and 35 have the H level values. Consequently, according to the first to third output voltages $V_{COM1}$, $V_{COM2}$, and $V_{COM3}$ applied, the charging controller 32 of the body 3 recognizes that the first battery pack 1 is connected to the body 3 and at the same time, the pack 1 is chargeable, thereby turning the switch 31 on.

On the other hand, when the temperature of the first pack 1 is in the high temperature range where the temperature is greater than t1, the resistance value of the thermistor 14 is lower than the above-described case that the temperature of the first pack 1 is equal to or less than t1. Thus, as shown by the curve I in FIG. 11, the first temperature detection voltages $V_{C1}$ varies within the range from V1 to (V/2). In this case, the first temperature detection voltages $V_{C1}$ is equal to or higher than the threshold voltages $V_{TH2}$ and $V_{TH3}$ of the second and third comparators 34 and 35 and therefore, the second and third output voltages $V_{COM2}$ and $V_{COM3}$ have the H level values. Also, the first temperature detection voltages $V_{C1}$ is less than threshold voltages $V_{TH1}$ of the first comparator 33 and therefore, the first output voltage $V_{COM1}$ has the L level value. Consequently, according to the first to third output voltages $V_{COM1}$, $V_{COM2}$, and $V_{COM3}$ applied, the charging controller 32 of the body 3 recognizes that the first battery pack 1 is connected to the body 3 and at the same time, the pack 1 is not chargeable, thereby turning the switch 31 off.

Next, the operation of the mobile phone according to the embodiment having the second battery pack 2 is explained below.

Since the thermistor 24 of the pack 2 also has a semiconductor resistive element having a negative temperature coefficient, the resistance value of the thermistor 24 decreases as the temperature rises. Thus, the resistance value of the thermistor 24 is large within the lower temperature range where the temperature of the pack 2 is lower than t1. Accordingly, the first temperature detection voltages $V_{C2}$ (i.e., the divided voltage by the resistive voltage-divider circuit comprising the thermistor 24 and the resistors 36 and 37) is low.

As a result, as shown by the curve II in FIG. 11, the second temperature detection voltages $V_{C2}$ varies within the range from 0 to V2 when the temperature of the second pack 2 is equal to or less than t1. In this case, the first temperature detection voltages $V_{C2}$ is equal to or less than the threshold voltages $V_{TH1}$, $V_{TH2}$, and $V_{TH3}$ of the first to third comparators 33, 34, and 35 and thus, all the first to third output voltages $V_{COM1}$, $V_{COM2}$, and $V_{COM3}$ of the first to third comparators 33, 34, and 35 have the L level values. Consequently, according to the first to third output voltages $V_{COM1}$, $V_{COM2}$, and $V_{COM3}$ applied, the charging controller 32 of the body 3 recognizes that the second battery pack 2 is connected to the body 3 and at the same time, the pack 2 is chargeable, thereby turning the switch 31 on.

On the other hand, when the temperature of the second pack 2 is greater than t1, the resistance value of the thermistor 24 is lower than the above-described case that the temperature of the second pack 2 is equal to or less than t1. Thus, as shown by the curve II in FIG. 11, the first temperature detection voltages $V_{C2}$ varies within the range from (V/2) to V2. In this case, the second temperature detection voltage $V_{C2}$ is less than the threshold voltages $V_{TH1}$ and $V_{TH3}$ of the first and third comparators 33 and 35 and therefore, the first and third output voltages $V_{COM1}$ and $V_{COM3}$ have the L level values. Also, the second temperature detection voltages $V_{C2}$ is equal to or greater than the threshold voltages $V_{TH2}$ of the second comparators 34 and therefore, the second output voltage $V_{COM2}$ has the H level value. Consequently, according to the first to third output voltages $V_{COM1}$, $V_{COM2}$, and $V_{COM3}$ applied, the charging controller 32 of the body 3 recognizes that the second battery pack 2 is connected to the body 3 and at the same time, the pack 2 is not chargeable, thereby turning the switch 31 off.

The above-explained operation of the first to third comparators 33, 34, and 35 and the charging controller 32 of the phone body 3 can be summarized as shown in the Table 1 listed below.

TABLE 1

| | | Comparator Output Level | | | Charging | |
|---|---|---|---|---|---|---|
| Case No. | Temp. Detect. Voltage [V] | First Comparator 33 | Second Comparator 34 | Third Comparator 35 | Controller Judgment Battery Pack | Charge-ability |
| 1 | 0~V2 | L | L | L | 2nd | Able |
| 2 | V2~V/2 | L | H | L | 2nd | Unable |
| 3 | V/2~V1 | L | H | H | 1st | Unable |
| 4 | V1~V | H | H | H | 1st | Able |

As seen from Table 1, the charging controller 32 can recognize whether the first or second battery pack 1 or 2 is connected to the phone body 3 according to the combination of the logic values of the output voltages $V_{COM1}$, $V_{COM2}$, and $V_{COM3}$ of the first to third comparators 33, 34, and 35. Moreover, the controller 32 can recognize which temperature range the first and second packs 1 and 2 belongs to and whether they are chargeable or not.

Accordingly, with the mobile phone according to the embodiment of the invention, dedicated terminals for discriminating the type of the first and second battery packs 1 and 2 are unnecessary and therefore, the count of the necessary terminals can be decreased in the packs 1 and 2 and the body 3. This means that the mobile phone can be made more compact and more light-weight easily.

In the above-explained embodiment of the invention, the invention is applied to a mobile phone and a thermistor is used as the temperature detection device. However, it is needless to say that the invention is not limited to this case and it can be applied to any other mobile or portable electronic devices and that any other type of temperature detection devices may be used for this purpose.

Furthermore, three comparators 33, 34, and 35 are used for discrimination of the type of battery packs in the above-explained embodiment of the invention. However, any other configuration may be used for this purpose.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of detecting the type of a battery pack in a mobile electronic device, comprising the steps of:
   (a) providing a first battery pack connectable to a body of a mobile electronic device;
   said first battery pack having a battery cell, a first terminal connected to a high-potential side terminal of said cell, a second terminal connected to a low-potential side terminal of said cell, a third terminal, and a temperature detection element connected across said second and third terminals;
   (b) providing a second battery pack connectable to said body of said device;
   said second battery pack being different in characteristic from said first battery pack;
   said second battery pack having a battery cell, a first terminal connected to a high-potential side terminal of said cell, a second terminal connected to a low-potential side terminal of said cell, a third terminal, and a temperature detection element connected across said first and second terminals;
   (c) providing said body of said device with a fourth terminal connectable to said first terminal of said first or second battery pack, a fifth terminal connectable to said second terminal of said first or second battery pack, a sixth terminal connectable to said third terminal of said first or second battery pack;
   said body of the device having a resistive voltage divider circuit connected among said fourth, fifth, and sixth terminals;
   (d) connecting said first or second battery pack to said body of said device in such a way that said fourth, fifth, and sixth terminals of said body of said device are connected to said first, second, and third terminals of said first or second battery pack, respectively;
   (e) detecting an output voltage of said resistive voltage divider of said body of said device, generating a detection result; and
   (f) judging whether said first or second battery pack is connected to said body of said device based on said detection result.

2. The method according to claim 1, wherein each of said first and second battery packs comprises
   a circuit for detecting whether or not said battery cell is in its normal condition; and
   a switch for stopping an output of said battery cell if said battery cell is not in its normal condition.

3. The method according to claim 1, wherein said body of said device comprises first, second, and third comparators having threshold values different from each other, and a discrimination circuit for discriminating between said first and second battery packs;
   and wherein said first, second, and third comparators compares the output of said resistive voltage-divider circuit with their threshold values, generating an comparison result signal to said discrimination circuit;
   and wherein said discrimination circuit discriminates between said first and second battery packs based on said comparison result signal.

4. The method according to claim 3, wherein said comparison result signal is a combination of three logic signals from said first, second, and third comparators.

5. A mobile electronic device comprising:
   (a) a first battery pack connectable to a body of a mobile electronic device;
   said first battery pack having a battery cell, a first terminal connected to a high potential side terminal of said cell, a second terminal connected to a low-potential side terminal of said cell, a third terminal, and a temperature detection element connected across said second and third terminals;
   (b) a second battery pack connectable to said body;
   said second battery pack being different in characteristic from said first battery pack;
   said second battery pack having a battery cell, a first terminal connected to a high-potential side terminal of said cell, a second terminal connected to a low-potential side terminal of the said, a third terminal, and a temperature detection element connected across said first and second terminals;
   (c) said body of said mobile electronic device having a fourth terminal, a fifth terminal, a sixth terminal, and a resistive voltage divider circuit connected among said fourth, fifth, and sixth terminals;
   said first terminal of said first or second battery pack being connectable to said fourth terminal of said body, said second terminal of said first or second battery pack being connectable to said fifth terminal of said body, said third terminal of said first or second battery pack being connectable to said sixth terminal of said body;
   (d) an output voltage of said resistive voltage divider of said body being detected to generate a detection result, when said first or second battery pack is connected to said body in such way that said fourth, fifth, and sixth terminals of said body are connected to said first, second, and third terminals of said first or second battery pack, respectively; and
   (e) whether said first or second battery pack is connected to said body is judged based on said detection result.

6. The device according to claim 5, wherein each of said first and second battery packs comprises a circuit for detecting whether or not said battery cell is in its normal condition; and a switch for stopping an output of said batter cell if said battery cell is not in its normal condition.

7. The device according to claim 5, wherein said body comprises first, second, and third comparators having threshold values different from each other, and a discrimination circuit for discriminating between said first and second battery packs;

and wherein said first, second, and third comparators compares the output of said resistive voltage-divider circuit with their threshold values, generating an comparison result signal to said discrimination circuit;

and wherein said discrimination circuit discriminates between said first and second battery packs based on said comparison result signal.

8. The device according to claim 7, wherein said comparison result signal is a combination of three logic signals from said first, second, and third comparators.

* * * * *